United States Patent
Yoshida

(10) Patent No.: US 8,844,719 B2
(45) Date of Patent: Sep. 30, 2014

(54) MODULE FOR STACKING THIN PANELS AND METHOD OF STACKING THIN PANELS

(75) Inventor: Kouichirou Yoshida, Tokyo (JP)

(73) Assignee: Kyoraku Co., Ltd., Kyoto-shi (JP)

(*) Notice: Subject to any disclaimer, the term of this patent is extended or adjusted under 35 U.S.C. 154(b) by 0 days.

(21) Appl. No.: 13/246,124

(22) Filed: Sep. 27, 2011

(65) Prior Publication Data
US 2012/0082537 A1 Apr. 5, 2012

(30) Foreign Application Priority Data

Sep. 30, 2010 (JP) .................................. 2010-220491
Sep. 25, 2011 (JP) .................................. 2011-208304

(51) Int. Cl.
- *B65D 85/48* (2006.01)
- *B65D 81/05* (2006.01)
- *B65D 57/00* (2006.01)
- *H01L 21/673* (2006.01)
- *H01L 31/042* (2014.01)

(52) U.S. Cl.
CPC .......... *H01L 31/0422* (2013.01); *B65D 81/053* (2013.01); *B65D 57/00* (2013.01); *Y02E 10/50* (2013.01); *H01L 21/67346* (2013.01); *B65D 85/48* (2013.01)
USPC ........ 206/453; 206/586; 206/509; 211/41.14; 211/41.1; 211/59.4

(58) Field of Classification Search
USPC ......... 206/448, 449, 453, 586, 499, 722, 322, 206/509, 511, 512, 503, 712, 710, 593; 211/41.14, 41.18, 59.4, 41.1; 248/345.1; 410/41, 99; 108/27; 150/158; 52/3; 220/4.26
See application file for complete search history.

(56) References Cited

U.S. PATENT DOCUMENTS 2,226,601 A * 12/1940 Euller ........................... 206/586
2,268,458 A * 12/1941 Moore ............................. 34/238
(Continued)

FOREIGN PATENT DOCUMENTS

DE 3701293 A1 * 4/1988 ................... 206/586
DK EP-0270512 A2 * 8/1988 ............. B65D 59/00
(Continued)

*Primary Examiner* — Anthony Stashick
*Assistant Examiner* — Mollie LLewellyn
(74) *Attorney, Agent, or Firm* — Westerman, Hattori, Daniels & Adrian, LLP

(57) ABSTRACT

A module for stacking thin panels and a method of stacking thin panels when a plurality of thin panels are vertically stacked in a state of being supported by the modules capable of securing an adequate load transfer area for transferring a load of the thin panels. The module for stacking the thin panels includes: a support portion for supporting the thin panel from below; a load transfer portion connected to the support portion for transferring a weight of the thin panel downward; and a drop-off preventing portion for regulating horizontal movement of the thin panel. The load transfer portion includes a load transfer surface extending outward from the support portion, the load transfer surface includes a load receiving surface provided in an upper portion of the module and a load releasing surface provided in a lower portion of the module, and the drop-off preventing portion includes a protrusion portion protruding downward from a lower portion of the module. When an upper module is stacked on a lower module such that the load releasing surface of the upper module is placed on the load receiving surface of the lower module, an outer surface of the protrusion portion of the upper module abuts on an upper inner surface of the lower module from an inner side thereof.

2 Claims, 11 Drawing Sheets

(56) References Cited

U.S. PATENT DOCUMENTS

| | | | |
|---|---|---|---|
| 2,738,564 A * | 3/1956 | Guinane | 432/259 |
| 3,446,345 A * | 5/1969 | Frosoy | 206/453 |
| 4,951,821 A * | 8/1990 | Kempkes | 206/453 |
| 8,109,393 B2 * | 2/2012 | Haeberlein | 211/41.14 |
| 8,328,020 B2 * | 12/2012 | Flossmann | 206/586 |
| 2006/0005875 A1 * | 1/2006 | Haberlein | 136/251 |
| 2007/0068882 A1 * | 3/2007 | Yoshizawa | 211/41.18 |
| 2008/0164173 A1 * | 7/2008 | Savakus | 206/454 |
| 2012/0163954 A1 * | 6/2012 | Yoshida | 414/802 |
| 2012/0235004 A1 * | 9/2012 | Belyea et al. | 248/345.1 |
| 2012/0305444 A1 * | 12/2012 | Fujita et al. | 206/701 |

FOREIGN PATENT DOCUMENTS

| | | |
|---|---|---|
| JP | 55-7790 A | 1/1980 |
| JP | 2006-032978 A | 2/2006 |

* cited by examiner

MODULE FOR STACKING THIN PANELS AND METHOD OF STACKING THIN PANELS

This application claims the priority of Japanese number 2010-220491 filed Sep. 30, 2010, and Japanese number 2011-208304 filed Sep. 25, 2011, hereby incorporated by reference.

BACKGROUND OF THE INVENTION

1. Technical Field

The present invention relates to a module for stacking thin panels and a method of stacking thin panels. The present invention particularly relates to a module for stacking a plurality of thin panels and to a method of stacking thin panels using such modules, the module allowing an adequate area for load transfer of the thin panels (load transfer area) to be secured when the plural thin panels are vertically stacked in a state of being supported by the modules. Alternatively, the present invention relates to a module for stacking a plurality of thin panels and a method of stacking thin panels using such modules, the modules allowing the plural thin panels to be efficiently and stably stacked in a vertical direction.

2. Background Art

Dedicated modules have been used heretofore to store or transport heavy fragile thin panels (e.g., solar panels) in a state of being vertically stacked without being in contact with one another.

Examples of such modules are disclosed in JP-A-2006-032978 (Patent Document 1) and JP-UM-A-55-007790 (Patent Document 2).

Such modules include a support surface for supporting a thin panel from below and a molded member. This molded member is disposed on an outer side of the support surface and extends in a vertical direction. The molded member has an upper portion and a lower portion that are provided with a recessed portion or a raised portion capable of being engaged with one another. The molded member transfers the weight of the thin panels downward by engagement with other molded members placed thereabove and therebelow.

Such modules are provided at four corners of the thin panel. The support surfaces of these four modules support the four corners of the thin panel. The four modules have the molded members that have raised portions provided in upper portions thereof, and these raised portions are engaged with the respective recessed portions provided in lower portions of the other four modules to be arranged thereon. Similarly, the other such arranged four modules have support surfaces for supporting another thin panel. Accordingly, the related art modules support the four corners of the thin panel with the support surfaces thereof. When the modules are vertically stacked with the molded members, a pillar body is formed. Therefore, the thin panels can be vertically stacked without being in contact with one another.

Such a module, however, has the following technical problems.

Firstly; the recessed portion or the raised portion having a positioning function is provided in upper and lower portions of the molded member having a load transfer function that transfers the weight of the thin panels downward, causing difficulty in securing adequate load transfer areas in the upper and lower portions of the molded member. Consequently, the load is not adequately transferred between the modules adjacent to each other in a vertical direction. Accordingly, the pillar body formed by combining the modules in a vertical direction is unstable, although the four modules can support one thin panel. Therefore, the pillar body has the possibility to crumble due to vibration particularly during transportation, causing the possibility of damaging the stacked thin panels.

Secondly, the related art modules have difficulty in stacking a plurality of thin panels efficiently and stably in a vertical direction.

For example, when the thin panels stacked using the modules are transported by a forklift, the thin panels are stacked on an upper surface of a palette by using modules. In this case, the modules need to be arranged beforehand on the upper surface of the palette in positions corresponding to four corners of the thin panel. Specifically, the related art modules support the four corners of the thin panel merely from only below with the support surfaces thereof. Thus, the modules are not fixed to the corners of the thin panel. Consequently, the support surfaces of the modules need to be arranged beforehand so as to correspond to the corners of the thin panel to support the thin panel by the modules. Therefore, the thin panels each having the four modules attached beforehand have difficulty in being stacked one after another on the upper surface of the palette. If thin panels are to be stacked in such a fashion, modules already stacked in a pillar shape on a palette lose stability or have the possibility to collapse.

SUMMARY

The present invention has been made to overcome the aforementioned technical problems, and an object of the present invention is to provide a module for stacking a plurality of thin panels and a method of stacking thin panels, the module and the method allowing an adequate area for load transfer of the thin panels (load transfer area) to be secured when the plural thin panels are vertically stacked in a state of being supported by the modules.

Moreover, another object of the present invention in light of the above technical problems is to provide a module for stacking a plurality of thin panels and a method of stacking thin panels, the module and the method allowing the plural thin panels to be efficiently and stably stacked in a vertical direction.

According to an aspect of the present invention, the module for stacking the thin panels includes: a support portion for supporting the thin panel from below; a load transfer portion connected to the support portion for transferring a weight of the thin panel downward; and drop-off preventing means for regulating horizontal movement of the thin panel. The load transfer portion includes a load transfer surface extending outward from the support portion. The load transfer surface includes a load receiving surface provided in an upper portion of the module and a load releasing surface provided in a lower portion of the module, and the drop-off preventing means includes a protrusion portion protruding downward from a lower portion of the module. When an upper module is stacked on a lower module in such a way that the load releasing surface of the upper module is adapted to be placed on the load receiving surface of the lower module, an outer surface of the protrusion portion of the upper module is adapted to abut on an upper inner surface of the lower module from an inner side thereof.

According to such a configuration of the module for stacking the thin panels, when the plural thin panels are stacked, the load receiving surface in an upper portion of the module that is used for supporting the thin panel from below is arranged on an outer side of the thin panel. On this load receiving surface, the load releasing surface in a lower portion of a next module is placed. The next module supports the thin plate from below, in such a manner that a load of the thin panel is transferred between the upper and lower modules. Moreover, an outer surface of the protrusion portion protruding downward from a lower portion of the upper module abuts on an upper inner surface of the lower module from an inner side thereof, thereby regulating relative movement of the upper module to an outer side of the lower module. Also, since the thin panel is provided between the modules, relative movement of the upper module to an inner side of the lower module is regulated. That is, the module is prevented from being dropped off caused by shift in a horizontal direction. Accordingly, unlike the known manner, the load receiving surface and the load releasing surface forming the load transfer surface do not have recessed-raised shaped positioning portions. Consequently, a size of a load transfer area does not have to be reduced to regulate relative movement of the upper module to an outer side and an inner side of the lower module. Therefore, an adequate area for load transfer of the thin panel can be secured.

In addition, the support portion is preferably a sandwich-and-support portion for sandwiching and supporting the thin panel. The sandwich-and-support portion includes an upper plate-shaped body, a lower plate-shaped body, and a vertical wall. The vertical wall links an outer edge of the upper plate-shaped body and an outer edge of the lower plate-shaped body by a manner in which the vertical wall forms a pocket having a generally U-shaped cross-section with the upper plate-shaped body and the lower plate-shaped body. The sandwich-and-support portion is adapted to sandwich and support the thin panel to be inserted between the lower plate-shaped body and the upper plate-shaped body from an opening portion of the pocket. The load transfer surface is preferably formed on an outer side of an outer surface of the vertical wall.

According to such a configuration of the module for stacking the thin panels, a thin panel is insertable between the lower plate-shaped body and the upper plate-shaped body from the opening portion of the pocket having the generally U-shaped cross-section of the sandwich-and-support portion, such that the module sandwiches and supports the thin panel. The load releasing surface of the upper module is to be placed on the load receiving surface of the lower module. Such placement allows the load transfer between the module sandwiching and supporting the lower thin panel and the module sandwiching and supporting the upper thin panel. Further, an outer surface of the protrusion portion protruding downward from a lower portion of the upper module is to abut on an upper inner surface of the lower module from an inner side thereof, thereby determining a horizontal position of the upper module by the lower module. Therefore, the thin panels are capable of being efficiently and stably stacked in a vertical direction.

Moreover, the protrusion portion preferably includes a first stepped portion formed on the load releasing portion, and a second stepped portion formed on the load receiving surface and having a shape complementary with the first stepped portion.

The first stepped portion may include a lower horizontal surface provided on a side closer to the sandwich-and-support portion, an upper horizontal surface provided on a side farther from the sandwich-and-support portion, and a first inclined surface that is provided between the lower horizontal surface and the upper horizontal surface and extends upward in an outward direction from an outer surface of the vertical wall. The second stepped portion may include a lower horizontal surface provided on a side closer to the sandwich-and-support portion, an upper horizontal surface provided on a side farther from the sandwich-and-support portion, and a second inclined surface that is provided between the lower horizontal surface and the upper horizontal surface and extends upward in an outward direction from the outer surface of the vertical wall. Between the modules in a stacked state, the lower horizontal surface, the first inclined surface, and the upper horizontal surface of the first stepped portion in the lower module may respectively abut on the lower horizontal surface, the second inclined surface, and the upper horizontal surface of the second stepped portion in the upper module.

Moreover, the first inclined surface preferably has an inclination angle of 60 to 75 degrees.

In addition, the load transfer portion may include a box-structured portion affixed to the outer surface of the vertical wall. The box-structured portion preferably includes therein-side ribs extending in a vertical direction. The box-structured portion preferably has an upper surface forming the load receiving surface and a lower surface forming the load releasing surface.

Moreover, the upper horizontal surface may be provided so as to be flush with an upper surface of the upper plate-shaped body, such that the upper surface of the upper plate-shaped body can form the load receiving surface. The lower horizontal surface may be provided so as to be flush with a lower surface of the lower plate-shaped body, such that the lower surface of the lower plate-shaped body can form the load releasing surface.

In addition, the box-structured portion may have a generally L-shaped horizontal cross-section. The upper horizontal surface, the first inclined surface, and the lower horizontal surface that form the load receiving surface may extend from a first end surface to a second end surface of the box-structured portion. The upper horizontal surface, the second inclined surface, and the lower horizontal surface that form the load releasing surface may extend from a first end surface to a second end surface of the box-structured portion.

Also, the protrusion portion may include an engagement portion that is formed on an inner edge of the lower plate-shaped body and is abuttable on an inner edge of the upper plate-shaped body.

According to such a configuration of the module for stacking the thin panels, a thin panel is insertable between the lower plate-shaped body and upper plate-shaped body from the opening portion of the pocket having a generally U-shaped cross-section in the sandwich-and-support portion, such that the module sandwiches and supports the thin panel. When an upper thin panel sandwiched and supported by a module is placed on a lower thin panel sandwiched and supported by a module, a load transfer surface of the upper module is placed on a load transfer surface of the lower module, thereby transferring a load between the upper and lower modules. Further, the engagement portion provided on an inner edge of the lower plate-shaped body of the upper module is to abut on an inner edge of the upper plate-shaped body of the lower module, such that a horizontal position of the upper module is determined by the lower module. Therefore, the thin panels are capable of being stacked efficiently and stably in a vertical direction.

Moreover, the engagement portion may include an inner fringe preferably extending downward from an inner edge of the lower plate-shaped body so as to be abuttable on an inner edge of the upper plate-shaped body from an inner side thereof.

Further, the load transfer surface preferably includes a load receiving horizontal surface provided in an upper portion of the module and a load releasing horizontal surface provided in a lower portion of the module.

The thin panel may be a solar panel having a rectangular shape.

The module may be made of resin and formed by integral molding.

According to another aspect of the present invention, a method of stacking thin panel includes: preparing modules for stacking the thin panels, the modules each including a support portion for supporting a thin panel from below, a load transfer portion connected to the support portion for transferring a weight of the thin panel downward, and drop-off preventing means for regulating horizontal movement of the thin panel by using a protrusion portion protruding downward from a lower portion of the module; and stacking the thin panels in sequence by supporting corners of the plural thin panels from below by the support portions of the modules and by vertically stacking the modules in a pillar shape such that the load transfer portions transfer a weight of the thin panels downward. The stacking step includes determining a horizontal position of an upper thin panel by a lower thin panel by allowing an outer surface of the protrusion portion of an upper module to abut on an upper inner surface of a lower module from an inner side thereof at the corners of the thin panels.

According to another aspect of the present invention, a method of stacking thin panel includes: preparing modules for stacking the thin panels, the modules each including a sandwich-and-support portion that includes a pocket having a generally U-shaped cross-section and being adapted to sandwich and support a thin panel, a load transfer portion connected to the sandwich-and-support portion for transferring a weight of the thin panel downward, and drop-off preventing means for regulating horizontal movement of the thin panel by using a protrusion portion protruding downward from a lower portion of the module; attaching the modules to four corners of the plural thin panels to be stacked; and stacking the thin panels in sequence by stacking the modules attached to the respective four corners of a thin panel on corresponding modules of another thin panel in a pillar shape such that a weight of the thin panels is transferred downward by the load transfer portions. The attaching step includes sandwiching and supporting the thin panel by the sandwich-and-support portion by inserting the thin panel between the lower plate-shaped body and the upper plate-shaped body from an opening portion of the pocket having the generally U-shaped cross-section. The stacking step includes determining a horizontal position of an upper thin panel by a lower thin panel by allowing an outer surface of the protrusion portion of an upper module to abut on an upper inner surface of a lower module from an inner side thereof.

According to such a method of stacking the thin panels, the modules are attached beforehand to the respective four corners of the plural thin panels to be stacked. Then, the modules attached to the four corners of the thin panels are stacked in a pillar shape. Herein, the outer surface of the protrusion portion of the upper module abuts on the upper inner surface of the lower module from the inner side thereof, thereby restricting horizontal movement of the upper module to an outer side of the lower module. Moreover, since the modules are attached to the respective four corners of the thin panels, the upper module is prevented from being slipped into an inner side of the lower module. Therefore, such a method determines the horizontal position of the upper thin panel by the lower thin panel. Moreover, the thin panels can be sequentially stacked in a vertical direction. Accordingly, for example, when thin panels are stacked on an upper surface of a palette to transport the stacked thin panels by a forklift, a known process may be skipped, the known process being such that new modules are stacked on the modules of the four corners of the thin panel already stacked, and then a new thin panel is placed on these new modules. That is, one by one placement of new modules is omitted for stacking a new panel thereon. According to the method, therefore, the modules can be attached beforehand to the plurality of thin panels to be stacked, thereby allowing for efficient and stable stacking of the thin panels.

Moreover, the sandwich-and-support portion may include the upper plate-shaped body, the lower plate-shaped body, and a vertical wall. The vertical wall links an outer edge of the upper plate-shaped body and an outer edge of the lower plate-shaped body such that the vertical wall forms the pocket having a generally U-shaped cross-section with the upper plate-shaped body and the lower plate-shaped body. The load transfer portion may include a load transfer surface formed on an outer side of an outer surface of the vertical wall. The load transfer surface includes a load receiving surface provided in an upper portion of the module and a load releasing surface provided in a lower portion of the module. The protrusion portion may include a first stepped portion formed on the load releasing surface, and a second stepped portion formed on the load receiving surface and having a shape complementary with the first stepped portion. The stacking step may allow the load releasing surface of the upper module to be placed on the load receiving surface of the lower module and the first stepped portion of the upper module to abut on the second stepped portion of the lower module from an inner side thereof.

In addition, the sandwich-and-support portion may include the upper plate-shaped body, the lower plate-shaped body, and a vertical wall. The vertical wall links an outer edge of the upper plate-shaped body and an outer edge of the lower plate-shaped body such that the vertical wall forms the pocket having a generally U-shaped cross-section with the upper plate-shaped body and the lower plate-shaped body. The load transfer portion may include a load transfer surface formed on an outer side of an outer surface of the vertical wall. The load transfer surface includes a load receiving surface provided in an upper portion of the module and a load releasing surface provided in a lower portion of the module. The protrusion portion may include an engagement portion that is formed on an inner edge of the lower plate-shaped body and is abuttable on an inner edge of the upper plate-shaped body. The stacking step may allow the load releasing surface of the upper module to be placed on the load receiving surface of the lower module and the engagement portion of the upper module to abut on an inner edge of the upper plate-shaped body of the lower module from an inner side thereof.

EXEMPLARY EMBODIMENTS

A detailed description of a module 10 according to a first embodiment of the present invention is given with reference to the drawings. In the description below, the module 10 is used for stacking rectangular solar panels P serving as an example of thin panels to be stacked.

The solar panel P includes cells that are serially connected, and resin, tempered-glass, and a metal frame for protection of these cells. The solar panel P is in the form of a thin plate. Specifically, the solar panel P has a laminated structure in which the cells made of silicone are embedded between a glass layer and a plastic layer or between glass layers. The solar panel P has a thickness of several millimeters (mm), an area of several square meters ($m^2$), and a weight of 10 to 30 kilograms (Kg). Thus, the solar panel P is a precise and fragile structural body.

This embodiment describes a case where four modules 10 for stacking the thin panels directly support four corners of the solar panel P, respectively.

The module 10 includes a sandwich-and-support portion, a load transfer portion, and drop-off preventing means. The sandwich-and-support portion sandwiches and supports the solar panel P. The load transfer portion is connected to the sandwich-and-support portion to transfer the weight of the solar panel P downward. The drop-off preventing means regulates horizontal movement of the solar panel P, and thus, to position the solar panel P in the horizontal direction.

Figure 1:
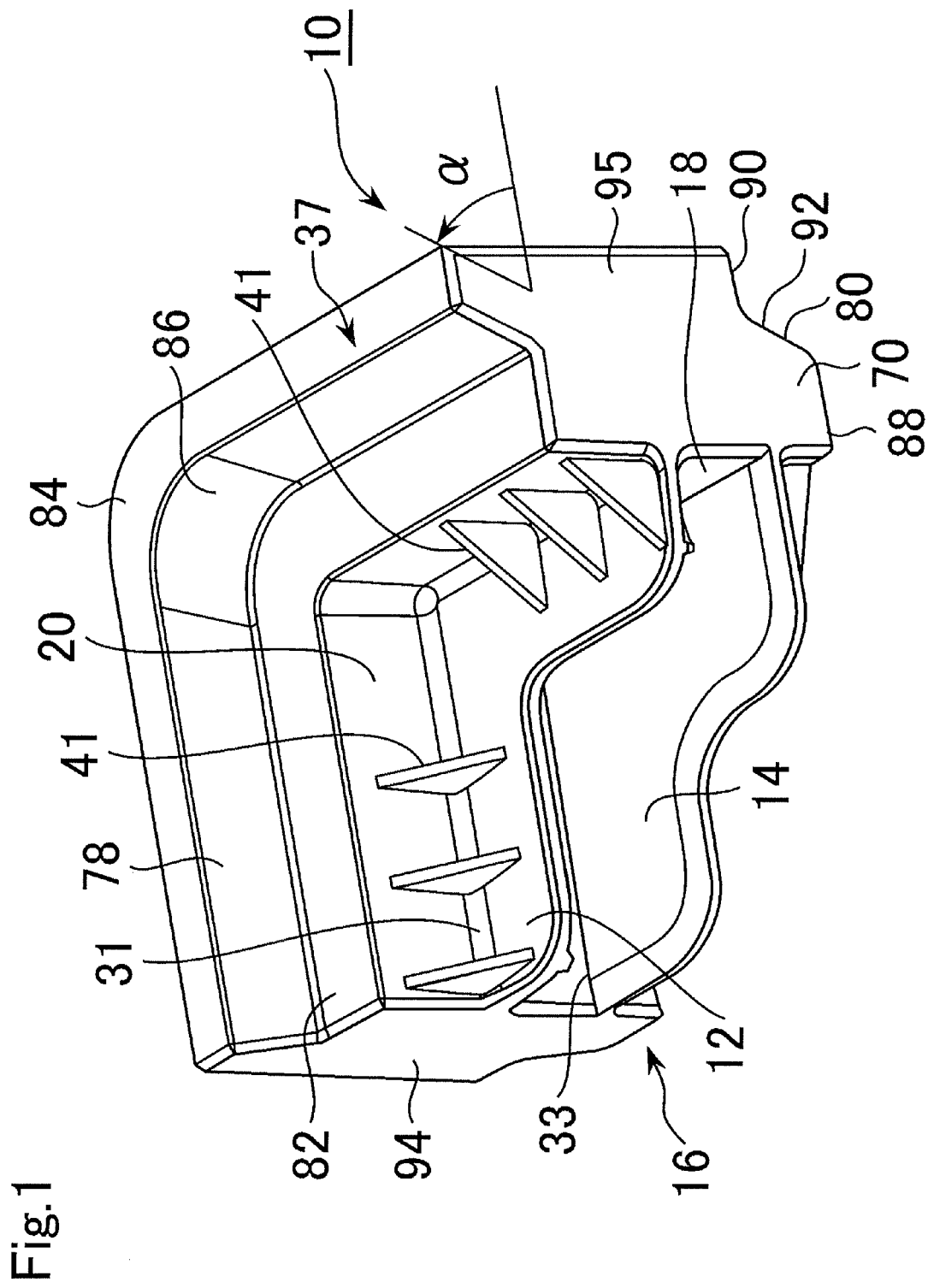
FIG. 1 is an entire perspective view as seen from obliquely above of a module for stacking solar panels according to a first embodiment of the present invention.
Figure 2:
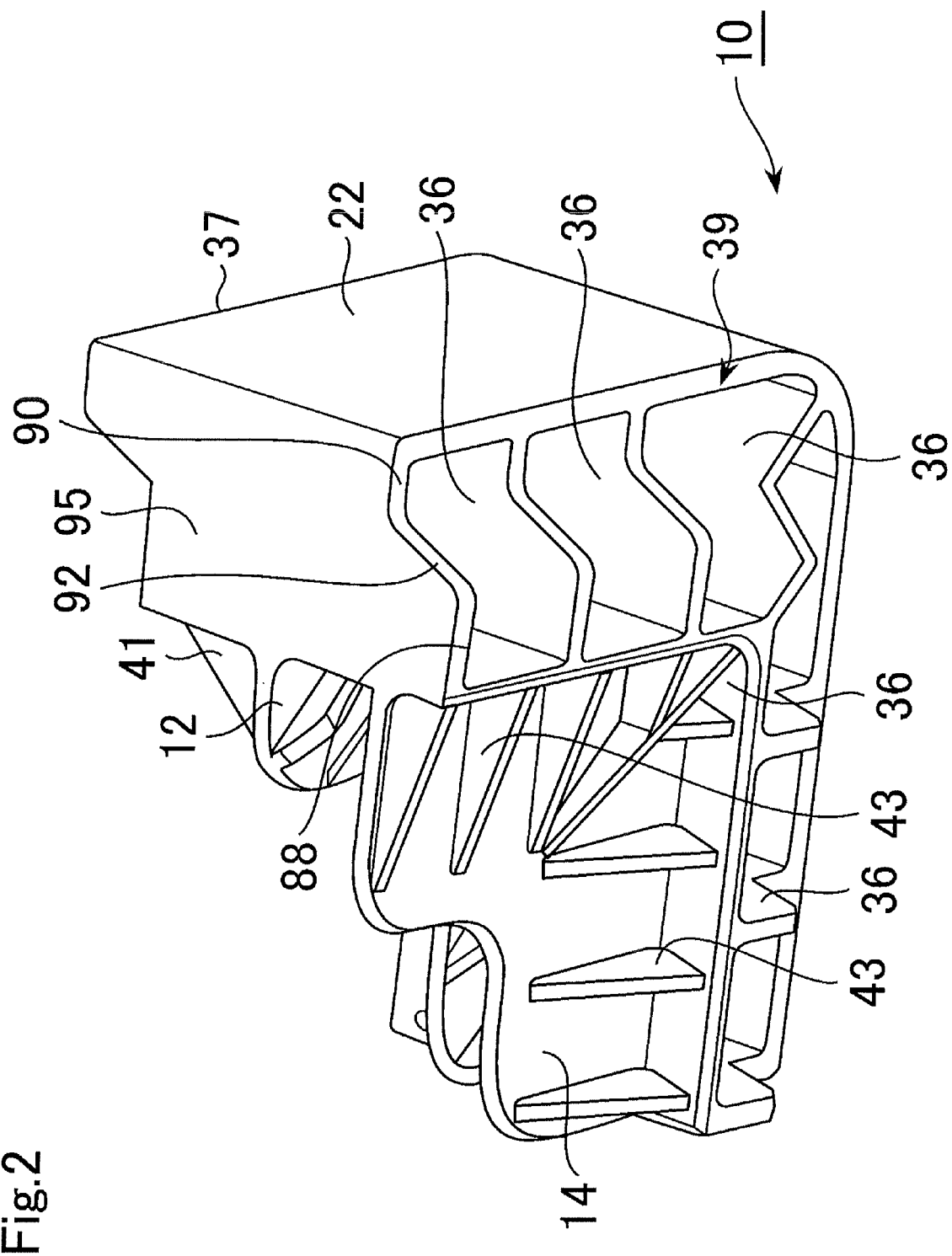
FIG. 2 is an entire perspective view as seen from obliquely below of the module for stacking the solar panels according to the first embodiment of the present invention.
Figure 3:
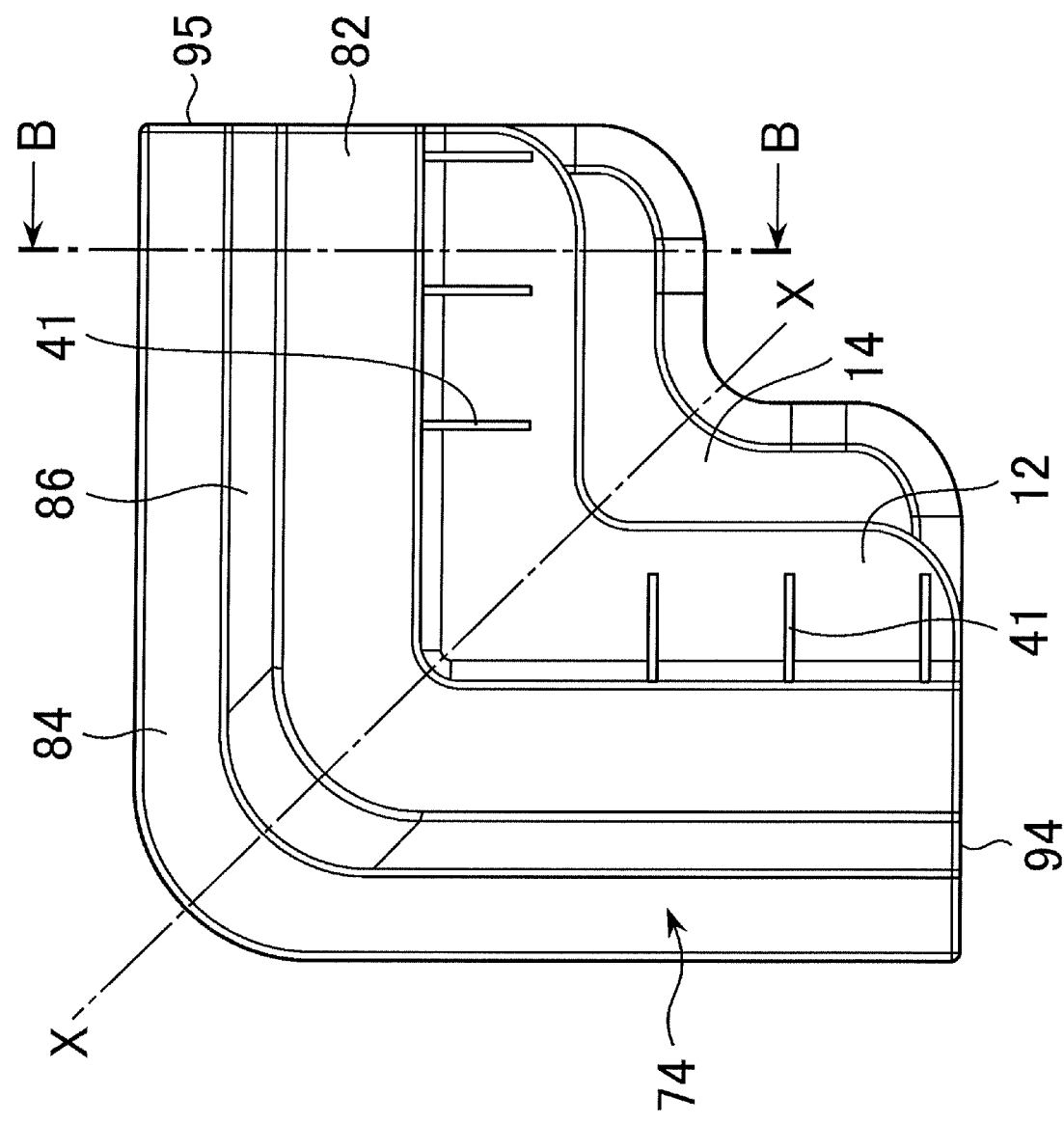
FIG. 3 is a plan view of the module for stacking the solar panels according to the first embodiment of the present invention.
Figure 4:
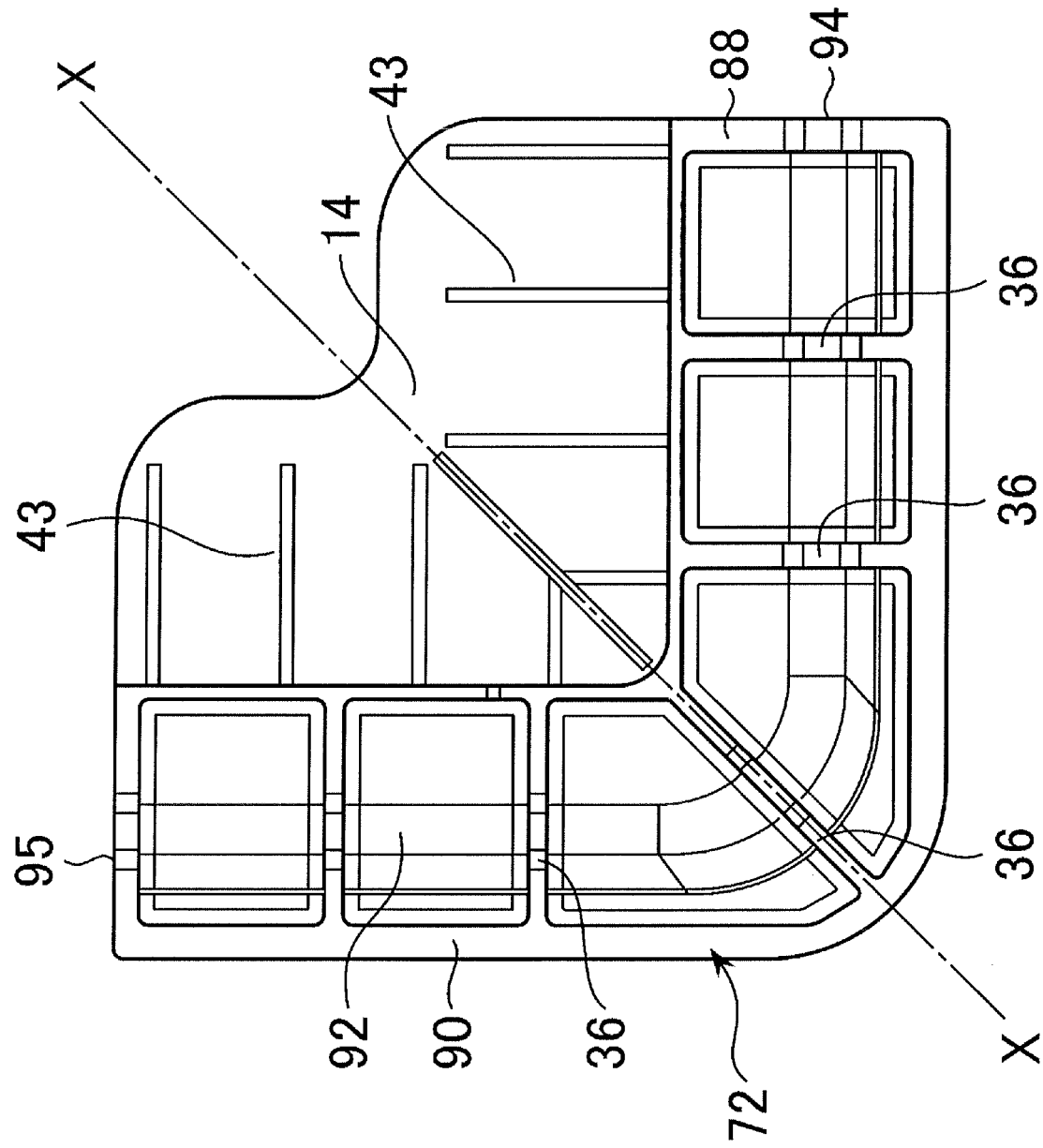
FIG. 4 is a bottom view of the module for stacking the solar panels according to the first embodiment of the present invention.
Figure 5:
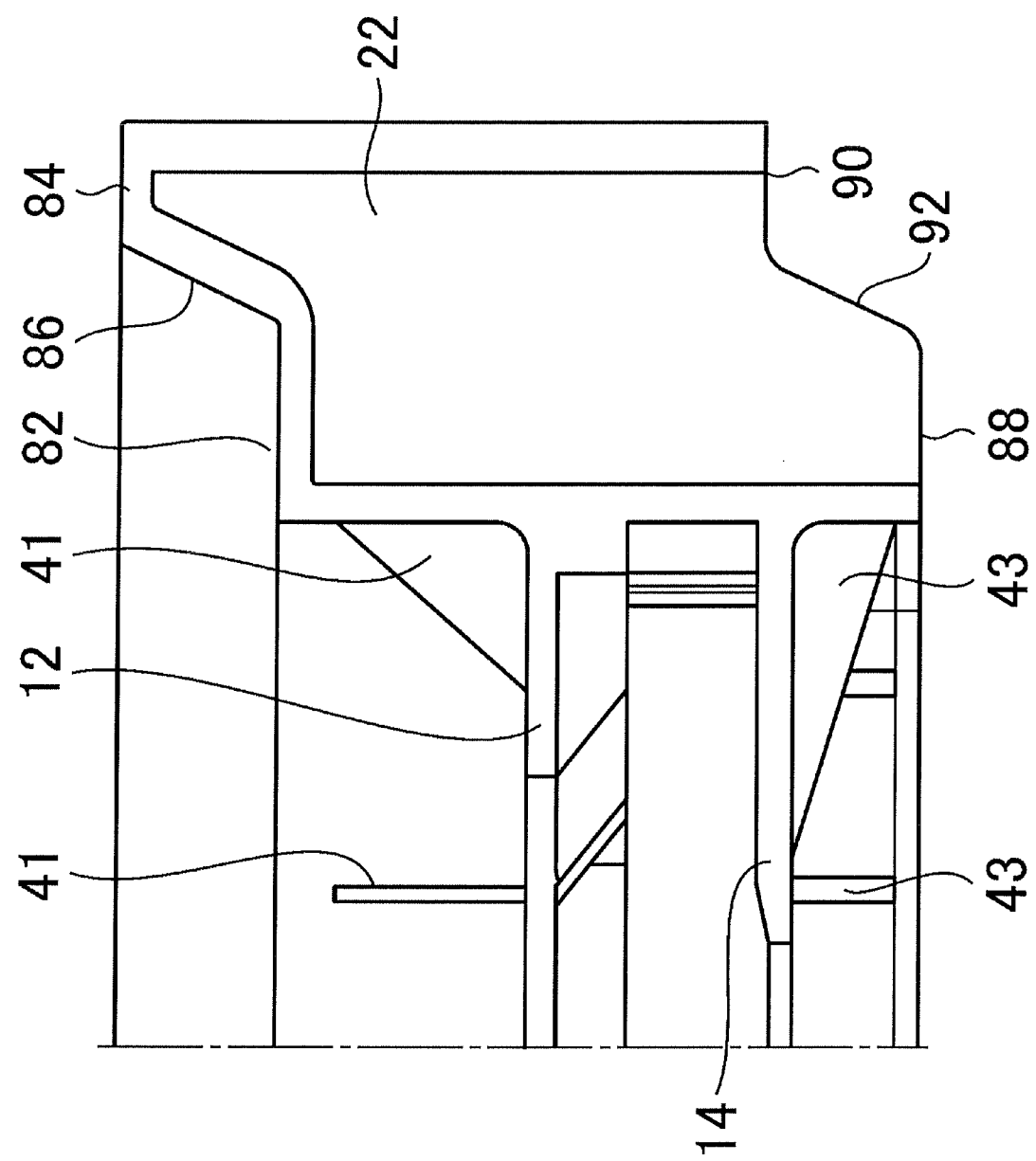
FIG. 5 is a cross-sectional view of the module taken along line B-B of FIG. 3.

As depicted in FIG. 1 through FIG. 5, the module 10 is symmetric with respect to a center line X-X (see, FIG. 3). The sandwich-and-support portion includes a plate-shaped body pair 16 and a vertical wall 18. The plate-shaped body pair 16 has an upper plate-shaped body 12 and a lower plate-shaped body 14 that are vertically disposed in parallel with a space therebetween. The vertical wall 18 links the upper plate-shaped body 12 and the lower plate-shaped body 14.

The load transfer portion includes a box-structured portion 22 that is affixed to an outer surface 20 of the vertical wall 18.

The module 10 is made of resin. The components (sandwich-and-support portion, load transfer portion, and drop-off preventing means) of the module 10 are integrally molded.

As described later, the modules 10 are attached to the four corners of the solar panel P, respectively.

That is, four modules 10 sandwich and support the four corners of the solar panel P, respectively. The modules 10 attached to the solar panel P are placed on the corresponding modules 10 attached to another solar panel P. Such placement is repeated, such that the modules 10 attached to the four corners of the solar panels P are stacked in a pillar shape. As a result, the solar panels P are stacked in a vertical direction.

Accordingly, the weight of the solar panels P is transferred through the modules 10 stacked in the pillar shape. The bottom of the modules 10 receives the whole weight of the stacked solar panels P.

The resin material for the module 10 may be a thermoplastic resin, such as a non-crystalline resin or an olefin resin (e.g., polyethylene or polypropylene). Specifically, the resin material for the module 10 may be a polyolefin (e.g., polypropylene or high-density polyethylene), which is a homopolymer or a copolymer of olefins, such as ethylene, propylene, butane, isoprene, pentane, and methylpentene. Since the structure of the module 10 is relatively complex, a material (e.g., polyolefin) suitable for integral molding by injection molding is specifically used.

The upper plate-shaped body 12 and the lower plate-shaped body 14 that form the plate-shaped body pair 16 are in an L-shape. As clearly depicted in FIG. 1, the vertical wall 18 is disposed in such a way that an outer edge 31 of the upper plate-shaped body 12 and an outer edge 33 of the lower plate-shaped body 14 are linked. Thus, the upper plate-shaped body 12, the lower plate-shaped body 14, and the vertical wall 18 form a pocket having a generally U-shaped cross-section.

Accordingly, the plate-shaped body pair 16 and the vertical wall 18 form the sandwich-and-support portion for sandwiching and supporting the solar panel P. That is, the solar panel P is inserted between the upper plate-shaped body 12 and the lower plate-shaped body 14 from an opening portion of the pocket having the generally U-shaped cross-section formed by the plate-shaped body pair 16 and the vertical wall 18, such that the plate-shaped body pair 16 and the vertical wall 18 sandwich and support the solar panel P.

Therefore, the space between a lower surface of the upper plate-shaped body 12 and an upper surface of the lower plate-shaped body 14 and the respective areas of the upper and lower plate-shaped bodies 12 and 14 may be determined in such a way that the solar panel P can be sandwiched and supported. Accordingly, the modules 10 sandwich and support the solar panel P, such that the modules 10 are fixed to the solar panel P. This allows for transportation of the solar panel P with the modules 10 attached to the four corners thereof as described later.

As depicted in FIGS. 1 and 2, the upper plate-shaped body 12 includes a stiffening rib 41, and the lower plate-shaped body 14 includes a stiffening rib 43. When the solar panel P is sandwiched and supported, the lower plate-shaped body 14 receives the weight of the solar panel P. Thus, the lower plate-shaped body 14 is supported from below by the stiffening rib 43.

Specifically, as depicted in FIG. 1, a plurality of stiffening ribs 41 is disposed at intervals from one another on an upper side and a lower side of the upper plate-shaped body 12. These stiffening ribs 41 link the outer surface 20 of the vertical wall 18 and the upper plate-shaped body 12. As depicted in FIG. 2, on the other hand, a plurality of stiffening ribs 43 is disposed at intervals from one another on an upper side and a lower side of the lower plate-shaped body 14. These stiffening ribs 43 link the outer surface 20 of the vertical wall 18 and the lower plate-shaped body 14. The number of stiffening ribs 41 and 43 and the intervals thereof may be determined according to the weight of the target solar panels P to be stacked.

The upper plate-shaped body 12 and the lower plate-shaped body 14 may be in a rectangular shape instead of being in an L-shape. The modules 10 may be respectively attached to middle portions of the sides of the solar panel P instead of the four corners of the solar panel P. Alternatively, rectangular modules 10 may be respectively attached to middle portions of sides of the solar panel P after L-shaped modules 10 are attached to the respective four corners of the solar panel P. Moreover, L-shaped modules 10 may be attached to any of the four corners of the solar panel P, and rectangular modules 10 may be attached to middle portions of any sides of the solar panel P. That is, the L-shaped modules 10 and the rectangular modules 10 may be used together.

As depicted in FIG. 2, the outer surface 20 of the vertical wall 18 is provided with the box-structured portion 22 that has ribs 36 thereinside and an L-shaped cross-section. The box-structured portion 22 forms the load transfer portion that has a load transfer surface formed on an outer side of the outer surface 20 of the vertical wall 18.

Specifically, the box-structured portion 22 includes an upper surface 37 and a lower surface 39 that are parallel to each other. When solar panels P are stacked using the modules 10, the upper surface 37 forms a load receiving surface 74 for receiving a load from an upper module 10A, whereas the lower surface 39 forms a load releasing surface 72 for applying a load to a lower module 10B.

The upper surface 37 has a flap as depicted in FIG. 1, whereas the lower surface 39 is open as depicted in FIG. 2.

The drop-off preventing means includes a protrusion portion 70 that protrudes downward from a lower portion of the module 10. When the upper module 10A is stacked on the lower module 10B, the load releasing surface 72 of the upper module 10A is placed on the load receiving surface 74 of the lower module 10B. Herein, an outer surface of the protrusion portion 70 of the upper module 10A abuts on an upper inner surface of the lower module 10B from an inner side thereof.

Specifically, the protrusion portion 70 includes a second stepped portion 80. The second stepped portion 80 is formed on the load releasing surface 72. A first stepped portion 78 is formed on the load receiving surface 74 and has a shape complementary with the second stepped portion 80.

As depicted in FIG. 1, the first stepped portion 78 includes a lower horizontal surface 82, an upper horizontal surface 84, and a first inclined surface 86. The lower horizontal surface 82 is provided on a side closer to the sandwich-and-support portion, whereas the upper horizontal surface 84 is provided on a side farther from the sandwich-and-support portion. The first inclined surface 86 is provided between the lower horizontal surface 82 and the upper horizontal surface 84. The first inclined surface 86 extends upward in an outward direction from the outer surface of the vertical wall 18.

The second stepped portion 80, on the other hand, includes a lower horizontal surface 88, an upper horizontal surface 90, and a second inclined surface 92 as depicted in FIG. 2. The lower horizontal surface 88 is provided on a side closer to the sandwich-and-support portion, whereas the upper horizontal surface 90 is provided on a side farther from the sandwich-and-support portion. The second inclined surface 92 is provided between the lower horizontal surface 88 and the upper horizontal surface 90. The second inclined surface 92 extends upward in an outward direction from the outer surface of the vertical wall 18.

Between the modules 10 that are vertically stacked and adjacent to each other, therefore, the lower horizontal surface 82, the first inclined surface 86, and the upper horizontal surface 84 of the first stepped portion 78 of the lower module 10B respectively abut on the lower horizontal surface 88, the second inclined surface 92, and the upper horizontal surface 90 of the second stepped portion 80 of the upper module 10A. Accordingly, the entire upper surface 37 of the box-structured portion 22 forms the load receiving surface 74, whereas the entire lower surface 39 of the box-structured portion 22 forms the load releasing surface 72.

Since the upper plate-shaped body 12 is positioned lower than the upper surface 37 of the box-structured portion 22, an upper surface of the upper plate-shaped body 12 does not form the load receiving surface 74. Moreover, since the lower plate-shaped body 14 is positioned higher than the lower surface 39 of the box-structured portion 22, a lower surface of the lower plate-shaped body 14 does not form the load releasing surface 72.

The upper horizontal surface 84, the first inclined surface 86, and the lower horizontal surface 82 that form the load receiving surface 74 extend from a first end surface 94 to a second end surface 95 of the box-structured portion 22. Similarly, the upper horizontal surface 90, the second inclined surface 92, and the lower horizontal surface 88 that form the load releasing surface 72 extend from the first end surface 94 to the second end surface 95 of the box-structured portion 22. The end surfaces 94 and 95 of the box-structured portion 22 are disposed so as to be flush with the respective edges of the vertical wall 18.

Figure 6:
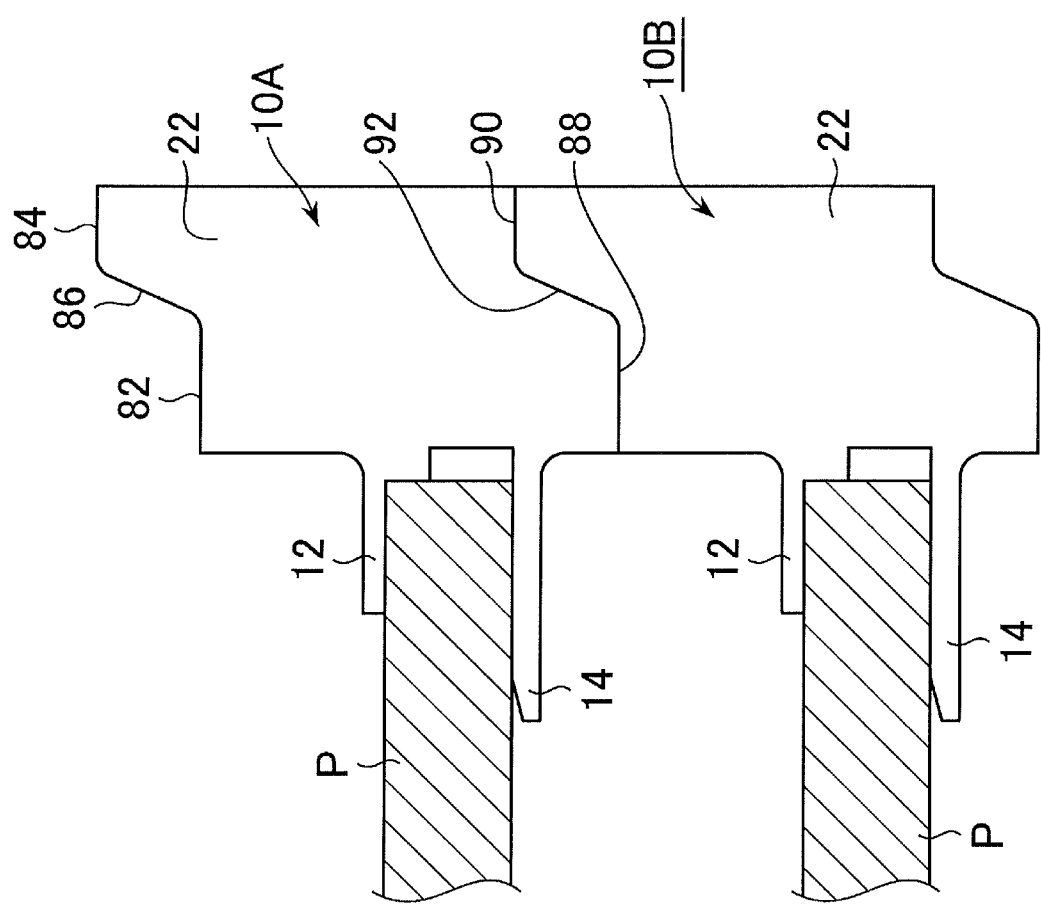
FIG. 6 is a partial schematic diagram depicting a state in which the modules for stacking the solar panels are stacked according to the first embodiment of the present invention.

In the above configuration, when the upper module 10A is stacked on the lower module 10B, the load releasing surface 72 of the upper module 10A is placed on the load receiving surface 74 of the lower module 10B. Herein, as depicted in FIG. 6, the second inclined surface 92 of the upper module 10A abuts on the first inclined surface 86 of the lower module 10B from an inner side thereof, thereby regulating horizontal movement of the upper module 10A to an outer side of the lower module 10B. In addition, the modules 10 are arranged on the four corners of the solar panel P. This arrangement also regulates slippage of the upper modules 10A into an inner side by the solar panel P, that is, horizontal movement of the upper modules 10A to an inner side of the lower modules 10B is regulated by the solar panel P.

Since the upper plate-shaped body 12 and the lower plate-shaped body 14 are in an L-shape as described above, a position of the module 10 can be regulated in two perpendicular directions on a horizontal surface. Specifically, the movement of the upper module 10A to an inner side of the lower module 10B is regulated in the two perpendicular directions. Moreover, movement of the upper module 10A to an outer side of the lower module 10B is regulated in the two perpendicular directions.

A plurality of ribs 36 is formed on the box-structured portion 22. The ribs 36 are parallel to the end surfaces 94 and 95 of the box-structured portion 22 and extend in a vertical direction.

Since the box-structured portion 22 forms the load transfer portion, the box-structured portion 22 preferably has greater strength. Thus, the areas of the upper and lower surfaces 37 and 39, and the thickness and the number of the ribs 36 in the box-structured portion 22 may be determined in such a way that the strength of the box-structured portion 22 is enhanced.

As a modified example, the lower horizontal surface 82 of the upper surface 37 of the box-structured portion 22 may be provided so as to be flush with an upper surface of the upper plate-shaped body 12. Such modification allows the upper surface of the upper plate-shaped body 12 to also form the load receiving surface 74. Moreover, the lower horizontal surface 88 of the lower surface 39 of the box-structured portion 22 may be provided so as to be flush with a lower surface of the lower plate-shaped body 14. Such modification allows the lower surface of the lower plate-shaped body 14 to also form the load releasing surface 72.

In addition, a slope (not shown) that is inclined downward toward the box-structured portion 22 may be provided in the vicinity of both ends of an inner edge on an upper surface of the lower plate-shaped body 14 to smoothly insert the solar panel P into an opening portion of the pocket having a generally U-shaped cross-section.

The first inclined surface 86 preferably has an inclination angle (a in FIG. 1) in a range of 60 to 75 degrees. That is, when such modules 10 are used to vertically stack a plurality of solar panels P as described later, the modules 10 may be attached to the respective four corners of the solar panels P beforehand. When the inclination angle of the first inclined surface 86 is within the above range, the solar panels P each having the modules 10 attached to the four corners thereof are readily stacked on an upper surface of a palette, for example. When the inclination angle of the first inclined surface 86 is smaller than 60 degrees, the solar panels P are stacked readily. However, the inclination angle of smaller than 60 degrees deteriorates the function of the first inclined surface 86 used to determine a horizontal position of an upper module by a lower module. When the inclination angle of the first inclined surface 86 is greater than 75 degrees, on the other hand, the function for determining the horizontal position is enhanced, while the solar panels P are difficult to be stacked.

The module 10 having the above configuration has effects that are described below through a method of vertically stacking the solar panels P by using the modules 10.

The description below is given of a case where a plurality of solar panels P is vertically stacked on an upper surface of a palette so that the stacked solar panels P can be transported by a forklift.

First, the modules 10 are attached to the respective four corners of a plurality of solar panels P that are going to be stacked. Specifically, a corner of the solar panel P is inserted to an opening portion (between the lower plate-shaped body 14 and upper plate-shaped body 12) of a pocket having a generally U-shaped cross-section of the module 10. The solar panel P is sandwiched by the lower plate-shaped body 14 and the upper plate-shaped body 12, such that four modules 10 are fixed to the four corners of the solar panel P, respectively.

Such a process is performed on the solar panels P. Preparation of the plural solar panels P each having the modules 10 attached to the four corners thereof can eliminate a process of attaching the modules 10 to the four corners of each solar panel P on a palette. Accordingly, the solar panels P can be efficiently stacked.

That is, when a plurality of solar panels P is stacked, the modules 10 attached to four corners of a solar panel P are stacked on the corresponding modules 10 of another solar panel P in such a manner as to be stacked in a pillar shape. Specifically, the second stepped portion 80 of a module (next module) 10 attached to a solar panel P to be stacked next abuts on the first stepped portion 78 of a module (top module) 10 attached to a solar panel P arranged on the top from an inner side thereof. Accordingly, the lower surface 39 of the box-structured portion 22 of the next module 10 is placed on the upper surface 37 of the box-structured portion 22 of the top module 10. Such placement allows the lower horizontal surface 88, the second inclined surface 92, and the upper horizontal surface 90 of the second stepped portion 80 of the next module 10 to respectively abut on the lower horizontal surface 82, the first inclined surface 86, and the upper horizontal surface 84 of the first stepped portion 78 of the top module 10. The load of the next module 10 is transferred from the lower surface 39 of the box-structured portion 22 thereof to the upper surface 37 of the box-structured portion 22 of the top module 10. Accordingly, the modules 10 are stacked at the four corners of the solar panels P.

When a next solar panel P is stacked on the top solar panel P, positions of the four modules 10 attached to the four corners of the next solar panel P are simultaneously determined by the corresponding four top modules 10. The angles of the second inclined surface 92 and the first inclined surface 86 are suitably set, thereby readily determining the positions of the modules 10.

Figure 7:
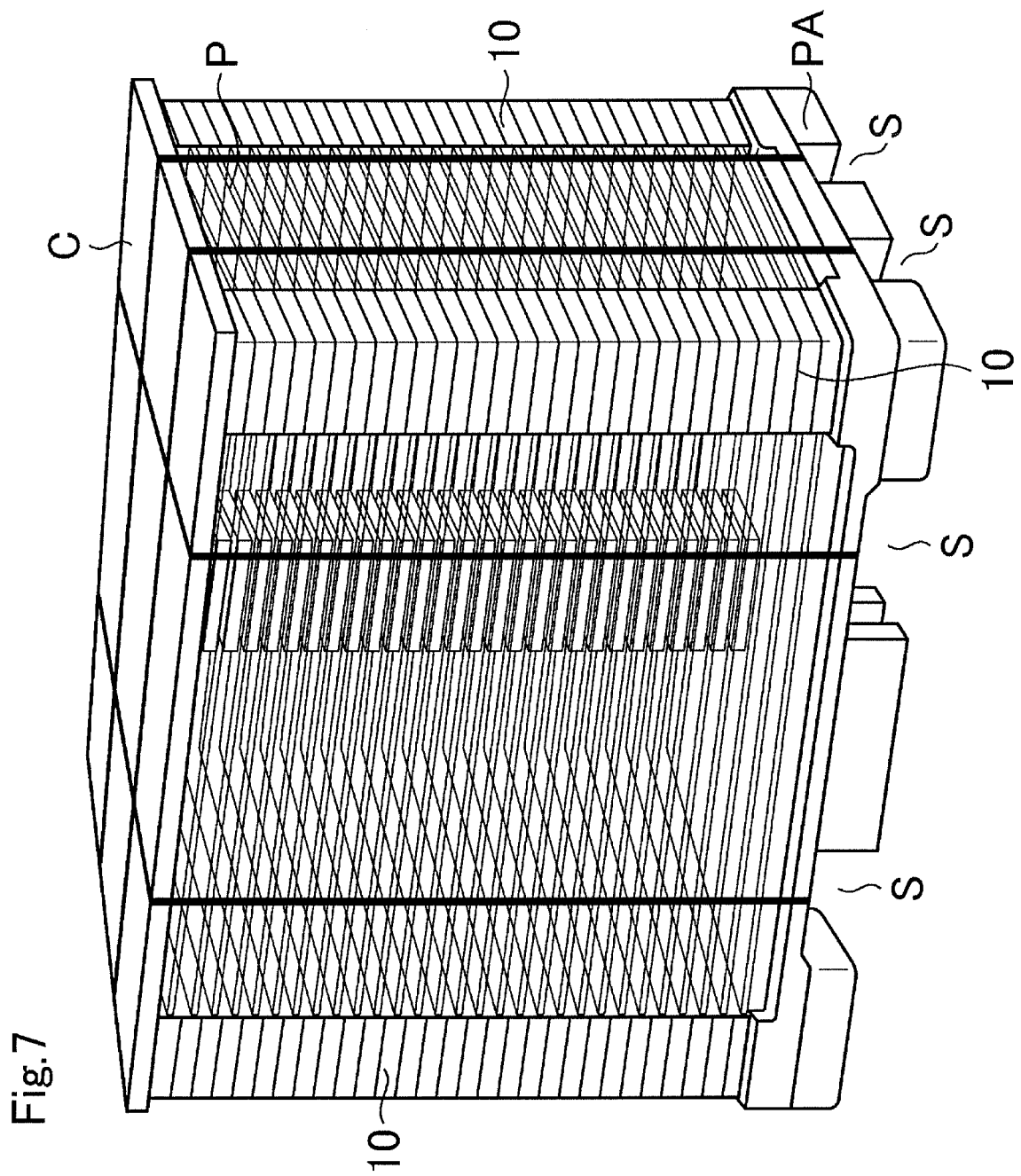
FIG. 7 is an entire perspective view depicting a state in which the solar panels have been stacked on a palette by using the modules for stacking the solar panels according to the first embodiment of the present invention.

Such a process is repeated, so that the plural modules 10 are stacked in a pillar shape at the four corners of the plural solar panels P as depicted in FIG. 7. Therefore, the plurality of solar panels P can be stacked in a vertical direction. Herein, between the modules 10 vertically adjacent to each other, the second stepped portion 80 of the upper module 10A abuts on the first stepped portion 78 of the lower module 10B from an inner side thereof, thereby restricting horizontal movement of the upper module 10A to an outer side of the lower module 10. Specifically, since the first stepped portion 78 and the second step portion 80 are formed in an L-shape, horizontal movement of the module 10 is restricted from two perpendicular directions. Moreover, the modules 10 are attached to the respective four corners of the plural solar panels P and then stacked in a pillar shape, thereby effectively preventing or restricting slippage of the upper module 10A into an inner side of the lower module 10B. Therefore, the horizontal position of the upper module 10A can be determined by the lower module 10B, and the solar panels P can be efficiently and stably stacked in a vertical direction.

In addition, for example, a plurality of solar panels P vertically stacked on a palette can be transported entirely by a forklift, including the palette located on the bottom. Accordingly, the stacked solar panels P can be transported to a predetermined location for storage.

At the storage location, there are cases where the stacked solar panels P are unstacked. In such a case, the stacked solar panels P can be efficiently unstacked by going through a reverse order of the stacking procedure. Specifically, a solar panel P is moved down in the order from the top of the pillar-shaped stacked solar panels P in a state where the modules 10 are attached to the respective four corners of the solar panels P, and the solar panels P unstacked are then moved to a desired location. Subsequently, the modules 10 are removed from the solar panels P.

According to the above described modules 10 for stacking thin panels (solar panels P), when the plural thin panels are stacked, the load receiving surface 74 in an upper portion of the module 10 that supports the thin panel from below is arranged on an outer side of the thin panel. On this load receiving surface 74, the load releasing surface 72 in a lower portion of a next module 10 is placed. The next module 10 supports the thin panel from below. Accordingly, the load is transferred between the upper module 10A and the lower module 10B. In addition, an outer surface 76 of the protrusion portion 70 that protrudes downward from a lower portion of the upper module 10A abuts on an upper inner surface of the lower module 10B from an inner side thereof, thereby restricting relative movement of the upper module 10A to an outer side of the lower module 10B. Moreover, the thin panel is provided between the modules 10, in such a manner that relative movement of the upper module 10A to an inner side of the lower module 10B is restricted. That is, the module 10 is prevented from being dropped off caused by shift in a horizontal direction. Accordingly, unlike in the related art, the load receiving surface 74 and the load releasing surface 72 that form the load transfer surface do not have to have recessed-raised positioning portions thereon. Consequently, the load transfer area does not have to be reduced to regulate the relative movement of the upper module 10A to an outer side and an inner side of the lower module 10. Therefore, an adequate area for load transfer of the thin panels can be secured.

Specifically, the thin panel is inserted between the lower plate-shaped body 14 and the upper plate-shaped body 12 from an opening portion of a pocket having a generally U-shaped cross-section of the sandwich-and-support portion, such that the module 10 sandwiches and supports the thin panel. The load releasing surface 72 of the upper module 10A is placed on the load receiving surface 74 of the lower module 10B. This placement allows the load transfer between a module 10 sandwiching and supporting a lower thin panel and a module 10 sandwiching and supporting an upper thin panel. Moreover, the outer surface 76 of the protrusion portion 70 protruding downward from a lower portion of the upper module 10A abuts on an upper inner surface of the lower module 10B from an inner side thereof. This allows a horizontal position of the upper module 10A to be determined by the lower module 10B, thereby efficiently and stably stacking the thin panels in a vertical direction.

According to the method of stacking the thin panels having the above configuration, the modules 10 are attached beforehand to the respective four corners of the plural thin panels that are to be stacked. Subsequently, the modules 10 attached to the four corners of the thin panels are stacked in a pillar shape. Herein, the outer surface 76 of the protrusion portion 70 of the upper module 10A abuts on the upper inner surface of the lower module 10B from the inner side thereof, thereby restricting the horizontal movement of the upper module 10A to an outer side of the lower module 10B. Moreover, since the modules 10 are attached to the respective four corners of the thin panels, the upper module 10A is prevented from slipping into the inner side of the lower module 10B. According to this method, therefore, the horizontal position of the upper thin panel is determined by the lower thin panel. Moreover, the thin panels can be sequentially stacked in a vertical direction. Thus, for example, when thin panels are stacked on an upper surface of a palette for transportation by a forklift, a known process may be skipped, the known process being such that new modules 10 are stacked on the corresponding modules 10 attached to the four corners of the thin panel already stacked, and then a new thin panel is placed on these new modules 10. That is, this method does not involve the new modules 10 being placed one by one to stack the new panel thereon. According to the method of the first embodiment, therefore, the modules 10 can be attached beforehand to a plurality of thin panels to be stacked, thereby efficiently and stably stacking the thin panels. In the first embodiment, the load transfer surface is provided with the first inclined surface 92 and the second inclined surface 86. These inclined surfaces prevent the module from being dropped off. Moreover, the load transfer portion determines the position of the module to be placed.

A second embodiment of the present invention is described in detail below. In the description below, components that are similar to those of the first embodiment are given like reference numerals and description thereof is not given. A detailed description is now given of characteristics of the second embodiment.

Figure 8:
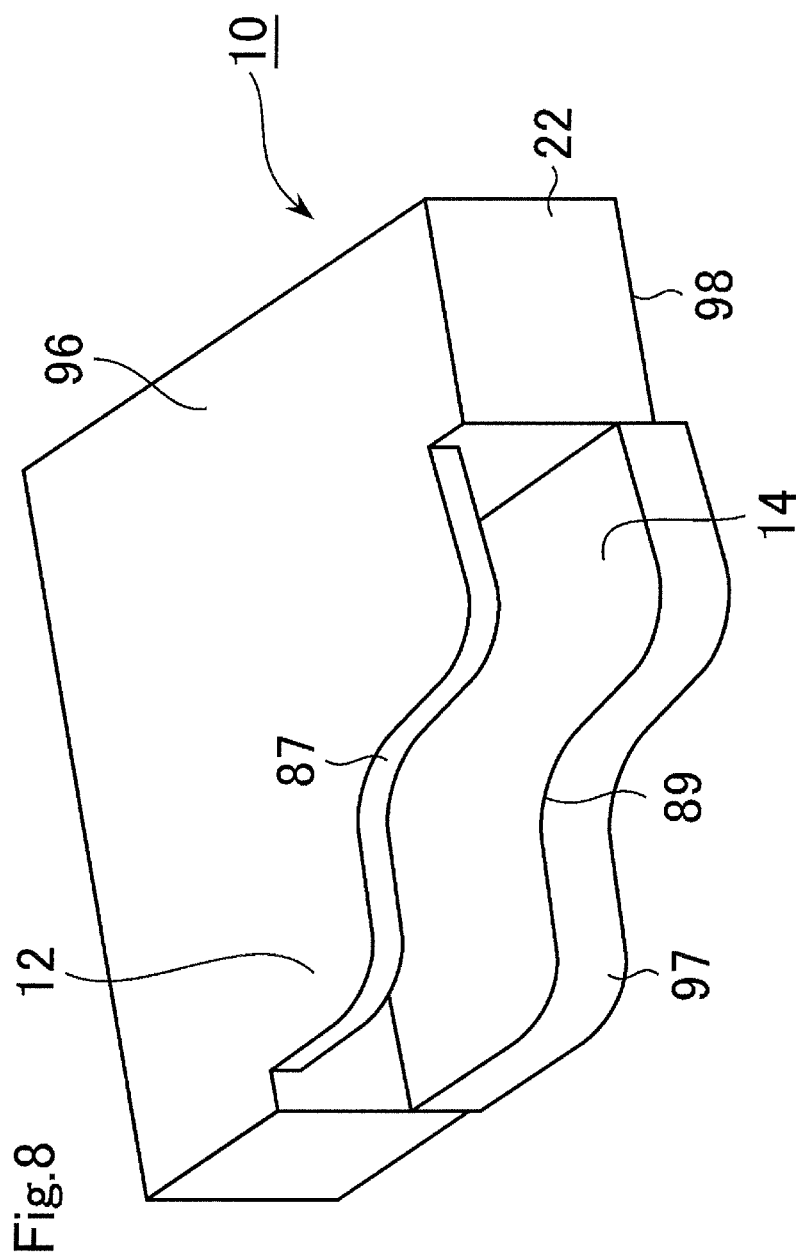
FIG. 8 is a diagram similar to FIG. 1, depicting a module for stacking solar panels according to a second embodiment of the present invention.
Figure 9:
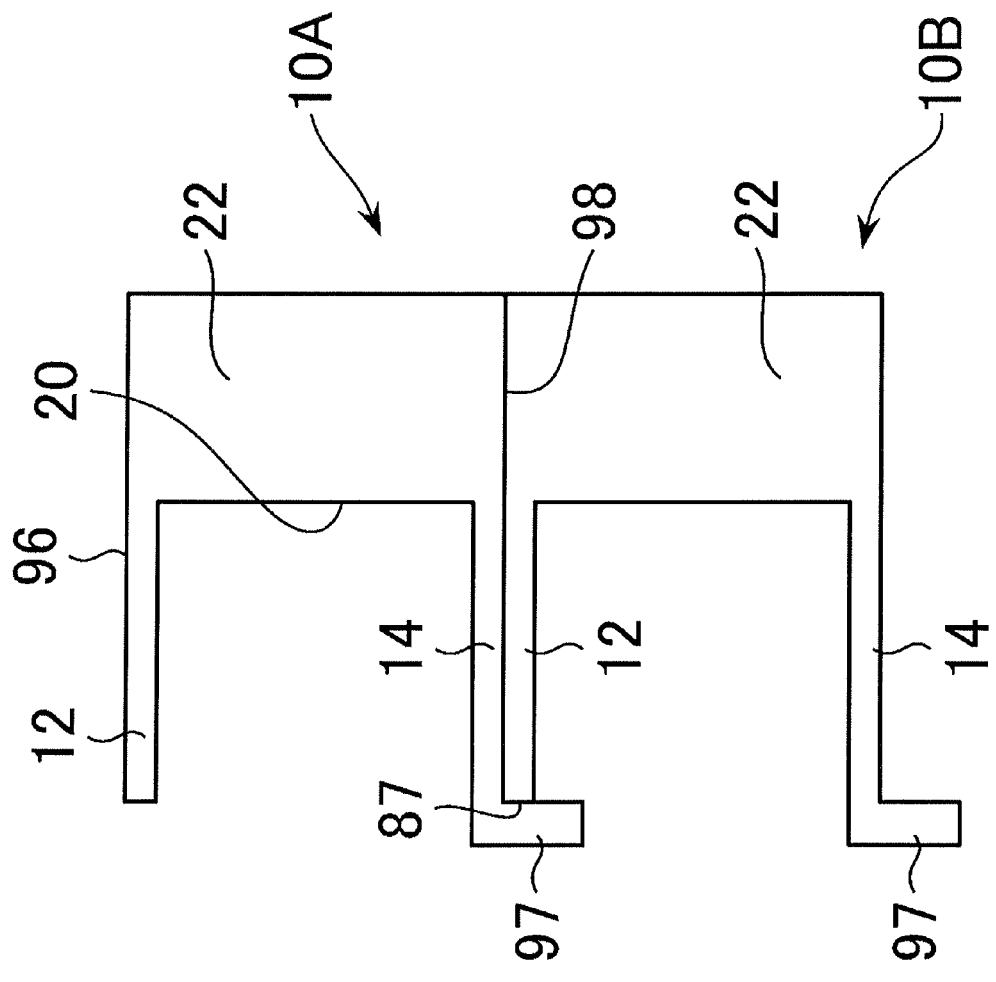
FIG. 9 is a partial schematic diagram depicting a state in which the modules for stacking the solar panels are stacked according to the second embodiment of the present invention.

FIGS. 8 and 9 depict a module 10 according to the second embodiment. A feature of the module 10 resides in the mode of determination of a horizontal position of a thin panel P. Thus, the module 10 has a structure that differs from that of the first embodiment. Specifically, the structure of a protrusion portion that protrudes downward from a lower portion of the module 10 is different.

More specifically, although the module 10 of the second embodiment allows an upper plate-shaped body 12 and a lower plate-shaped body 14 to sandwich and support each of the four corners of a thin panel as similar to that of the first embodiment, the protrusion portion of the module 10 of the second embodiment has an engagement portion that is abuttable on an inner edge 87 of the upper plate-shaped body 12 as depicted in FIG. 8. This engagement portion is provided to an inner edge 89 of the lower plate-shaped body 14 and has an inner fringe 97. This inner fringe 97 extends downward from the inner edge 89 of the lower plate-shaped body 14, thereby allowing the inner fringe 97 to abut on the inner edge 87 of the upper plate-shaped body 12 from an inner side thereof.

The inner fringe 97 extends across the entire inner edge 89 of the lower plate-shaped body 14. The inner fringe 97 has the amount of downward protrusion that can be optionally determined as long as the inner fringe 97 can abut on the inner edge 87 of the upper plate-shaped body 12.

Therefore, when modules (upper modules) 10 attached to the four corners of a thin panel P is placed on the corresponding modules (lower modules) 10 of a thin panel P that is already stacked, the inner fringes 97 of the lower plate-shaped bodies 14 of the upper modules 10A abut on the inner edges 87 of the upper plate-shaped bodies 12 of the lower modules 10B. Consequently, relative movement of the upper modules 10A to an outer side of the lower modules 10B is restricted. Moreover, since the modules 10 are arranged at the four corners of the thin panels, relative movement of the upper modules 10A to an inner side of the lower modules 10B is restricted by the thin panels P. Accordingly, the upper module 10A is also prevented from being slipped into an inner side of the lower module 10B.

In addition, the module 10 of the second embodiment is similar to that of the first embodiment regarding the configuration in which upper and lower surfaces of a box-structured portion 22 forms a load transfer surface. However, unlike the load transfer surface of the first embodiment, the load transfer surface of the second embodiment has a load receiving horizontal surface 96 that is provided on an upper portion of the module 10 and a load releasing horizontal surface 98 that is provided on a lower portion of the module 10. As depicted in FIG. 9, the lower plate-shaped body 14 has a lower surface that is flush with the lower surface of the box-structured portion 22. Thus, the lower surface of the lower plate-shaped body 14 also forms the load receiving horizontal surface 96. The upper plate-shaped body 12 has an upper surface that is flush with an upper surface 37 of the box-structured portion 22, such that the upper surface of the upper plate-shaped body 12 also forms the load releasing horizontal surface 98. Accordingly, the module 10 of this embodiment is capable of having a larger load transfer surface including a load receiving surface 74 and a load releasing surface 72 than that of the first embodiment. The module 10 of this embodiment, therefore, is suitable for a case where heavy thin panels are stacked.

According to a method of stacking thin panels P by using the modules 10 of this embodiment, four corners of a thin panel P are sandwiched and supported by the corresponding modules 10 as similar to those of the first embodiment. Also, the respective four corners of a plurality of thin panels P that is to be stacked are sandwiched and supported by the corresponding modules 10 before the thin panels P are stacked as similar to the first embodiment. However, the method of this embodiment differs from that of the first embodiment in the following points.

In a stacking step, the load releasing surfaces 72 of the upper modules 10A are placed on the load receiving surfaces 74 of the lower modules 10B at the respective four corners of the thin panel. Herein, the inner fringe 97 serving as an engagement portion of the upper module 10A abuts on the inner edge 87 of the upper plate-shaped body 12 of the lower module 10B from an inner side thereof.

Such a process is repeated, so that the modules 10 are stacked in a pillar shape at the four corners of the plural thin panels P as depicted in FIG. 9. Consequently, the plurality of thin panels P can be vertically stacked without contacting one another.

In addition, for example, a plurality of vertically stacked thin panels P can be transported entirely by a forklift including a palette at the very bottom tier for storage at a predetermined location. The module 10 of this embodiment allows the plate-shaped body pair 16 and the box-structured portion 22 to have adequate load support areas. Thus, between the modules 10 vertically adjacent to each other, the upper module 10A is stably supported by the lower module 10B. Moreover, the inner fringe 97 suppresses horizontal movement of the upper module 10A to an outer side of the lower module 10B. The modules 10 are arranged at the four corners of the thin panel P. Such an arrangement suppresses relative movement of the upper module 10A to an inner side of the lower module 10B. Consequently, the modules 10 stacked in the pillar shape and the thin panels P supported by these modules 10 can be stably transported even when some vibration occurs especially during the transportation.

A third embodiment of the present invention is described in detail below. In the description below, components that are similar to those of the first embodiment are given like reference numerals and description thereof is not given. A detailed description is given of characteristics of the third embodiment.

A feature of a module 10 according to this embodiment resides in the support mode of a thin panel P. The module 10 of the third embodiment has a structure (specifically, support portion) that differs from that of the first embodiment.

Specifically, in the first embodiment, the module 10 includes a sandwich-and-support portion to sandwich and support a thin panel P. This sandwich-and-support portion includes: a plate-shaped body pair 16 having an upper plate-shaped body 12 and a lower plate-shaped body 14; and a vertical wall 18 linking the upper plate-shaped body 12 and the lower plate-shaped body 14. The upper plate-shaped body 12 and the lower plate-shaped body 14 are linked parallel to each other with a space therebetween in a vertical direction. In the module 10 of the third embodiment, a member for supporting a thin panel P from below is a support plate 99 on which the thin panel P is placed.

Figure 10:
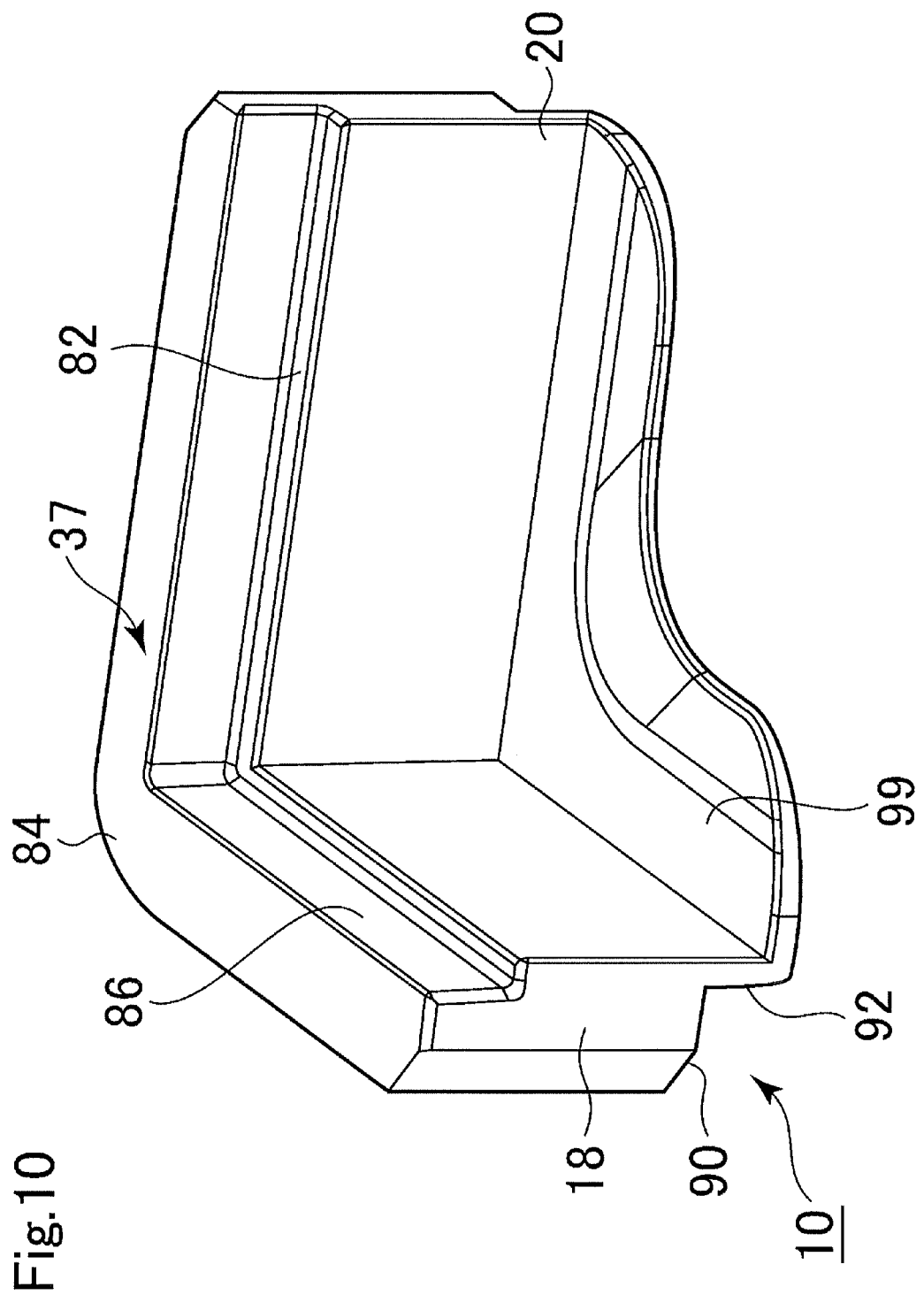
FIG. 10 is a diagram similar to FIG. 1, depicting a module for stacking solar panels according to a third embodiment of the present invention.
Figure 11:
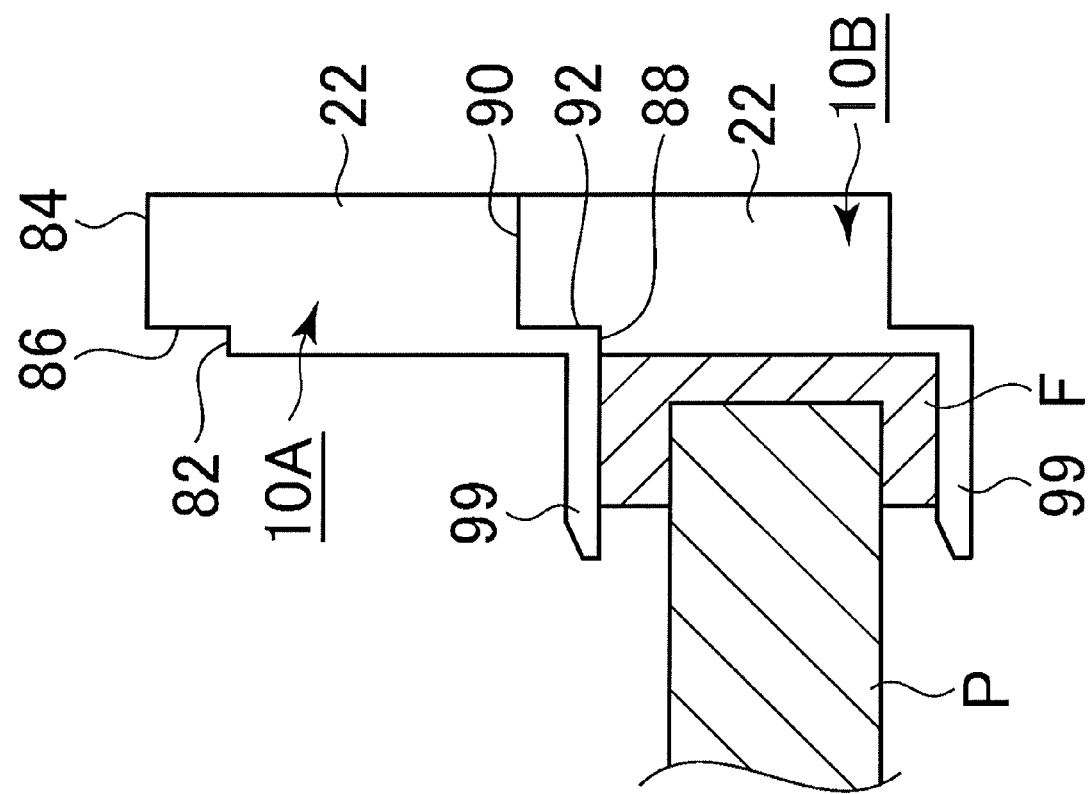
FIG. 11 is a partial schematic diagram depicting a state in which the modules for stacking the solar panels are stacked according to the third embodiment of the present invention.

As depicted in FIGS. 10 and 11, the support plate 99 is in an L-shape as similar to the lower plate-shaped body 14 of the first embodiment. Since the support plate 99 supports the weight of the thin panel P, a lower surface of the support plate 99 is provided with a plurality of stiffening ribs 43 that are provided at predetermined intervals from one another. The stiffening rib 43 links an outer surface 20 of the vertical wall 18 and the lower plate-shaped body 14. The number of the stiffening ribs 43 and the intervals therebetween may be determined according to the weight of target solar panels P to be stacked.

The module 10 has drop-off preventing means and a load transfer portion that are similar to those of the first embodiment. The module 10 of this embodiment includes such a support plate 99 and is an integrally molded component as similar to the first embodiment.

Such a module 10 is suitable for transportation of a solar panel P that has a metal frame fitted into an outer peripheral edge thereof. In this case, four corners of the metal frame are placed on upper surfaces of the support plates 99 of the corresponding modules 10. For example, the module 10 of this embodiment is suitable for a case, for example, where the solar panels P are stored for a relatively long period of time in a state of being stacked and have a relatively small amount of vertical distortion caused by, for example, vibration during transportation. More specifically, in comparison with the support mode of the solar panel P by the modules 10 of the first embodiment, the four corners of the solar panel P in this embodiment are supported so as to be free ends, causing the possibility of an increase in the amount of vertical distortion of the solar panel P. However, the metal frame fitted into the outer peripheral edge of the solar panel suppresses an increase in the distortion amount. The module 10 of this embodiment indirectly supports the solar panel P through the metal frame. The module 10, therefore, is suitable for a case where the solar panels P are stored for a long period of time.

In this embodiment, the solar panel P is simply placed on the support plate 99 unlike the first embodiment. Consequently, the module 10 of this embodiment is usable for a variety of sizes (thicknesses) of solar panels P. A plurality of solar panels P having different thicknesses can be stacked using a plurality of the identical modules 10.

In addition, when solar panels P are stacked using the modules 10 of this embodiment, the modules 10 are arranged beforehand in positions corresponding to the four corners of the solar panel P. Herein, the positions are the locations on which the solar panels P are to be stacked (e.g., on palette). The solar panel P is placed on the support plates 99 of the arranged modules 10. In this embodiment, therefore, the solar panels P cannot be stacked one after another on the palette unlike the first embodiment in which the modules 10 are attached beforehand to the respective four corners of the plural solar panels P to be stacked, and then the solar panels P with the attached modules 10 are carried to the palette and stacked by stacking the modules 10 on the corresponding modules 10.

In the first embodiment, when a next solar panel P is stacked on the solar panels P that are already stacked, positions of the four modules 10 attached beforehand to the four corners of the next solar panel P are determined at a time with respect to the corresponding modules 10 of a solar panel P at the very top tier. Such positioning of the modules 10 requires certain skills. In the stacking operation of the solar panels P according to this embodiment, however, four corners of a next solar panel P may be placed on the support plates 99 of the modules 10 that are positioned beforehand, thereby facilitating the stacking operation of the solar panels P.

The present invention has been described above with reference to particular embodiments, but the present invention is not limited thereto. It will be apparent to those skilled in the art that the described embodiments may be modified or altered in various ways without departing from the scope of the present invention.

For example, the first through third embodiments may be modified or altered as follows. For example, in the first and second embodiments, since the modules 10 support a solar panel P, the solar panel P is directly sandwiched and supported by the modules 10. The sandwiching and supporting manner enables firm support of the solar panel P in comparison with a case where a solar panel P placed on modules is supported merely from below. Therefore, the sandwich and support of the solar panel P is suitable for the direct support of the solar panel P. However, the first and second embodiments are not limited thereto. For example, an outer peripheral edge of the solar panel P may be fitted into a metal frame according to the weight and/or the transportation manner of the solar panel P, and then four corners of the metal frame may be indirectly sandwiched and supported by the modules 10. In the third embodiment, on the other hand, an outer peripheral edge a solar panel P is provided with a metal frame that is fitted thereinto to support the solar panel P by the modules 10. Thus, the four corners of this metal frame are placed on the modules 10, thereby supporting the solar panel P from below. However, the third embodiment is not limited thereto. For example, the modules 10 may directly support the solar panel P from below without using the metal frame when, for example, the weight of the solar panel P is relatively light, the vibration during transportation is small, and the storage space (specifically, height) is limited.

In this embodiment, moreover, the identical modules 10 are attached to the four corners of all the plural solar panels P and are stacked in a pillar shape to stack the plural solar panels P in a vertical direction. However, the identical modules 10 do not have to be used to stack the solar panels P. The lower the tier of the modules 10, the greater the number of the solar panels P to support is. Thus, the greater the strength that is desired, corresponds to the lowering of the tier of the modules 10. Therefore, modules 10 having the same shape with different thicknesses may be used, and the thicknesses of the modules 10 may be increased with lowering tier.

What is claimed is:

1. A module for use with a plurality of like modules for stacking thin panels, the module comprising:
   an upper portion and a lower portion;
   a sandwich-and-support portion including a pocket having a generally U-shaped cross-section for sandwiching and supporting a corner or a middle portion of a side of a thin panel from below, the sandwich-and-support portion including an upper plate-shaped body, a lower plate-shaped body, and a vertical wall, the vertical wall linking an outer edge of the upper plate-shaped body and an outer edge of the lower plate-shaped body such that the vertical wall forms the pocket having a generally U-shaped cross-section with the upper plate-shaped body and the lower plate-shaped body;
   a load transfer portion connected to the sandwich-and-support portion for transferring a weight of the thin panel downward, the load transfer portion including a load transfer surface formed on an outer side of an outer surface of the vertical wall, the load transfer surface including a load receiving surface provided in the upper portion of the module and a load releasing surface provided in the lower portion of the module;
   a protrusion portion protruding downward from the lower portion of the module and formed at an inner side of the lower portion of the module, the protrusion portion including an engagement portion that is formed on an inner edge of the lower plate-shaped body and is abuttable on an inner edge of the upper plate-shaped body of another like module stacked therebelow, and
   drop-off preventing means for regulating horizontal movement of the thin panel by using the protrusion portion.

2. A method of stacking a plurality of thin panels using modules, the modules each being as claimed in claim 1, the method comprising the steps of:
   attaching the modules to respective four corners of the plurality of thin panels to be stacked; and
   following the step of attaching the modules, stacking the thin panels in sequence by stacking the modules attached to the four corners of one of the thin panels on corresponding modules of another thin panel in a pillar shape such that a weight of the thin panels is transferred downward by the load transfer portions, wherein
   the attaching step includes sandwiching and supporting the thin panel by the sandwich-and-support portion by inserting the thin panel between the lower plate-shaped body and the upper plate-shaped body from an opening portion of the pocket having the generally U-shaped cross-section, and
   the stacking step includes determining a horizontal position of an upper thin panel in relation to a lower thin panel by allowing an outer surface of the protrusion portion of an upper module to abut on an upper inner surface of a lower module from an inner side thereof; and
   the stacking step allows the load releasing surface of the upper module to be placed on the load receiving surface of the lower module and the engagement portion of the upper module to abut on the inner edge of the upper plate-shaped body of the lower module from the inner side thereof.

* * * * *